United States Patent [19]

Yoshida et al.

[11] 4,295,898
[45] Oct. 20, 1981

[54] METHOD OF MAKING ISOLATED SEMICONDUCTOR DEVICES UTILIZING ION-IMPLANTATION OF ALUMINUM AND HEAT TREATING

[75] Inventors: Masakatsu Yoshida, Ibaraki; Yoshihiko Tochio, Kyoto; Atsutomo Tohi, Hirakata, all of Japan

[73] Assignee: Matsushita Electronics Corporation, Kadoma, Japan

[21] Appl. No.: 147,715

[22] Filed: May 8, 1980

[30] Foreign Application Priority Data

May 15, 1979 [JP] Japan ................... 54-60131

[51] Int. Cl.³ .................... H01L 21/265; H01L 21/20
[52] U.S. Cl. ..................... 148/1.5; 148/175; 148/190; 148/191; 357/48; 357/63
[58] Field of Search .............. 148/1.5, 175, 190, 191; 357/48, 63

[56] References Cited

U.S. PATENT DOCUMENTS

| | | | |
|---|---|---|---|
| 3,752,715 | 8/1973 | Antipov et al. | 148/191 X |
| 3,847,677 | 11/1974 | Takeda et al. | 148/1.5 |
| 3,930,909 | 1/1976 | Schmitz et al. | 148/175 |
| 3,992,232 | 11/1976 | Kaji et al. | 148/191 X |
| 4,128,439 | 12/1978 | Jambotkar | 148/1.5 |

OTHER PUBLICATIONS

Fairfield et al., "Reducing Autodoping in Epitaxial Silicon" IBM Tech. Discl. Bull., vol. 14, No. 5, Oct. 1971, p. 1634.

Primary Examiner—L. Dewayne Rutledge
Assistant Examiner—W. G. Saba
Attorney, Agent, or Firm—Cushman, Darby & Cushman

[57] ABSTRACT

In forming p+-type isolation region to define an isolated n-type island region in an n-type epitaxial layer grown on a p-type semiconductor substrate, the p+-type isolation region is formed by burying, prior to the growing of the epitaxial layer, an Al-ion-implanted region in the p-type substrate by means of ion implantation and subsequent heat-treatment for driving-in, thereby enabling a very quick forming of the isolation region and an accurate control of the resistivity of the epitaxial layer.

3 Claims, 9 Drawing Figures

METHOD OF MAKING ISOLATED SEMICONDUCTOR DEVICES UTILIZING ION-IMPLANTATION OF ALUMINUM AND HEAT TREATING

BACKGROUND OF THE INVENTION

1. Field of the Invention

The present invention relates to an improvement of a method of making semiconductor devices, and particularly concerns a method of forming an isolation region in a semiconductor wafer to define isolated island region(s) in an epitaxial layer formed on a substrate.

2. Prior Art

As is known, a bipolar type semiconductor integrated circuit (hereinafter referred as IC) is made by obtaining an island region of n-conductivity type in a n-type epitaxial layer grown on a p-type silicon substrate by forming a p+-type isolation region to encircle and define the island region, and subsequently forming various kinds of devices and interconnections thereof.

In a high voltage type bipolar IC comprising transistors and diodes of high working voltage, the n-type epitaxial layer has such a large thickness of 15 to 50 μm. Accordingly, the depth of the p+-type isolation region, which must be extended from the surface of the n-type region into the underlying p-type substrate, must necessarily have a large depth of diffusion. And such a large depth leads to a long time of diffusion process, and hence a poor productivity. Furthermore when an n+-type buried collector region of a high impurity concentration is formed in the p-type silicon substrate, the abovementioned long time diffusion process makes the high concentration n+-type impurity into the n-type epitaxial layer, thereby lowering the working voltage of the device, which has been intended to be increased.

In order to shorten the diffusion time, a method of diffusing the impurity into the epitaxial layer from both sides thereof has been proposed. The method is that prior to the epitaxial growth, a first region of p+-type impurity of a predetermined pattern is selectively formed on the substrate and a second region of p+-type impurity of the same pattern is formed on the surface of the epitaxial layer, and then a diffusion is carried out to diffuse impurities of both the first and the second regions simultaneously, so that the impurities from both regions diffuse into the epitaxial layer and become connected by superimposing each other in the epitaxial layer. Hereinafter, let us refer the method as "graft isolation" method since the isolation region is formed by connection of the upward diffusion of the impurity of the first region and the downward diffusion of the impurity of the second region, and both the diffused regions are grafted each other. In the conventional graft isolation method, both of the first and the second region of p+-type impurity are formed by disposing boron as impurity, and the surface impurity concentration of the p+-type region is usually selected lower than $1 \times 10^{19}$ atoms/cm$^3$ in order to decrease adverse auto-doping of boron into the epitaxial layer. The problem of such conventional graft isolation method is that due to such limitation of the impurity concentration, and intended shortening of the diffusion time is not satisfactorily achieved, though the diffusion time is shortened to some extent in comparison with the old isolation method to diffuse only from the surface of the epitaxial layer. For example, when the abovementioned graft isolation method is used in forming an isolation region penetrating through an epitaxial layer of 30 μm thickness and 10 Ωcm specific resistance by diffusing known boron from both sides of the epitaxial layer, the diffusion time under the temperature of 1200° C. is so long as about 6 hours. As is abovementioned, a measure to increase the impurity concentration of the first and the second regions causes the adverse auto-doping, thereby deteriorating controllability of the specific resistance and crystal perfection of the epitaxial layer, and hence, the conventional grafting isolation method could not achieve a high productivity and long life of the device.

SUMMARY OF THE INVENTION

Therefore, the present invention is for providing an improved method of making the isolation region which method is capable of shortening the diffusing time without deteriorating yield and life time of the device.

DESCRIPTION OF PREFERRED EMBODIMENT

The feature of the present invention is, in making an isolation region in a semiconductor IC by utilizing the graft isolation method, to adopt aluminum as impurity to form a first and a second p+-regions of the same predetermined patterns, the first p+-region being buried in a substrate and the second p+-region being on the surface of an epitaxial layer formed on the substrate, thereby forming an isolation region by grafting a first diffused region formed by diffusion from the first p+-region with a second diffused region formed by diffusion from the second p+-region.

The first p+-region is completely buried in the substrate, for example, of silicon. The burying is made by the following procedure:

After implanting of Al-ions from the principal surface of a silicon substrate by utilizing an SiO$_2$ film as mask, a known drive-in process is carried out to diffuse the Al-ions into the substrate. During the driving process, the Al-ions diffuses downwards into the substrate and at the same time the Al-ions evaporate from the principal surface of the silicon substrate so that the impurity concentration at the surface of the substrate becomes almost equal to the original impurity concentration of the substrate itself. That is, as a result of the drive-in process, the substrate becomes to have a structure that a p+-type region with a high concentration impurity (Al) is completely buried in the substrate. The reason why such burying is possible is that the Al-ions as p+-type impurity is very much liable to evaporate out of the substrate surface in comparison with the conventional p-type impurity such as boron. Since the p+-region made by the abovementioned way is sufficiently buried in the substrate, when forming an epitaxial layer on the surface of the substrate by epitaxial growing, there is no fear of causing the adverse auto-doping by the Al-ions as p-type impurity. Therefore, by adoption of the Al-ions as the p+-impurity, the controllability of the specific resistivity of the n-type epitaxial layer can be remarkably increased. Since the diffusion coefficient of Al is about 10 times as large as that of boron, and the abovementioned structure (that the p+-type region is completely buried in the substrate) enables a use of a sufficiently high concentration of Al as p+-impurity without fear of inducing the auto-doping, the working time for forming the isolation region in the epitaxial layer by the graft isolation method can be remarkably shortened.

Hereinafter, a detailed example of forming isolation region in a high working voltage bipolar IC is elucidated by referring to the accompanying drawing FIG. 1 to FIG. 9.

Figure 1:
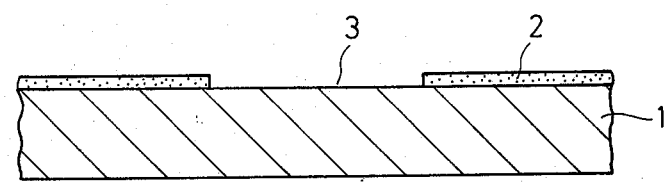
FIG. 1 to FIG. 9 are sectional side views to illustrate steps of making of a bipolar IC embodying the present invention.

On a p-type silicon substrate 1 having (111) surface and specific resistance of 5 Ωcm, an SiO$_2$ film 2 of about 1 μm thickness is formed by thermal oxidation method by exposing the substrate to an oxidizing atmosphere of about 1100° C.–1200° C. comprising O$_2$ carrier and steam. Then as shown in FIG. 1, a window 3 for forming an n$^+$-type collector region 4' therethrough is formed by known photo-etching method.

Figure 2:
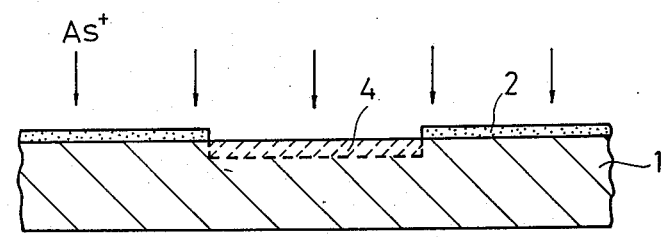
Figure 3:
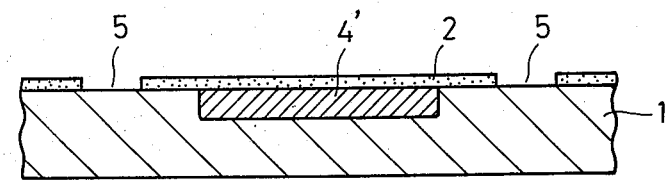

Then, as shown in FIG. 2, As$^+$-ions are implanted with a dose of 5×10$^{15}$ atoms/cm$^2$, thereby forming an ion-implanted region 4. Subsequently, heat treatments for an aneal to activate the As-ions in the region 4 and for drive-in the same are carried out, thereby forming the n$^+$-type buried collector region 4' having about 10 μm depth and a sheet resistance of about 15 Ω/□ in the substrate 1. After covering the whole area of the substrate surface by an SiO$_2$ film by known method, window 5 for forming p$^+$-type isolation region therethrough is formed by known photoetching method as shown by FIG. 3.

Figure 4:
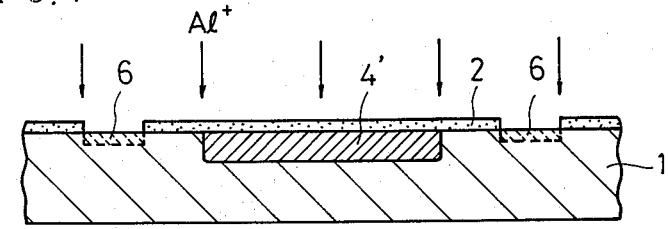
Figure 5:
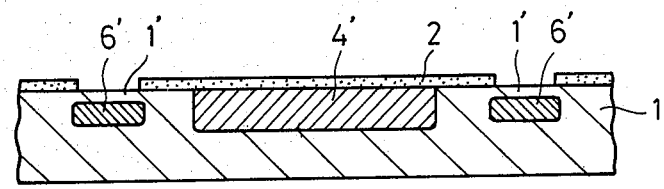
Figure 6:
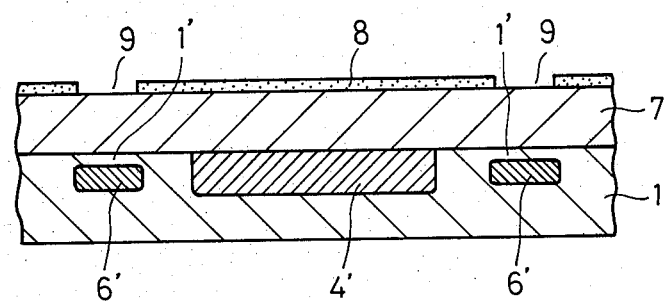

Then as shown by FIG. 4, Al-ions are implanted under the following condition:
implanted energy—80 KeV,
implanted dose—5×10$^{15}$ atoms/cm$^2$,
thereby to form an ion-implanted region 6 of a predetermined pattern. In an actual device, the pattern of the ion-implanted region 6 is an encircling pattern so as to define an island region therein. After a heat treatment for activation of the As-ions as impurity is made for 30 minutes at the temperature of about 900° C. in nitrogen atmosphere, a heat treatment for the drive-in is carried out for one hour at 1200° C. in nitrogen atmosphere. As a result of the drive-in, p$^+$-buried region 6' is formed as shown in FIG. 5, wherein the region 6' is completely buried in the silicon substrate 1. The p$^+$-buried region 6' is buried in the silicon substrate to lie at the depth between 1 μm to 10 μm. That is, as a result of the abovementioned evaporation of Al-ions out of the substrate surface, a 1 μm thick part of p-type substrate above the buried region 6' is left without doped by Al-ions.

As a conclusion, the abovementioned feature of complete burying of the p$^+$-region 6' in the substrate is obtainable by the high evaporation speed of Al-ions out of the substrate surface thereby by drastic lowering of the concentration of Al-ions as p$^+$-type impurity near the substrate surface in a very short time. Thus the impurity concentration of the Al-ions of the p-type part 1' above the buried region 6' is almost the same with that of the p-type substrate 1. Such process is realized by an unexpected utilization of a very fast evaporation of aluminum, which has hitherto been regarded as adverse nature as impurity.

After forming the p$^+$-type buried region 6' in the p-type substrate, the whole SiO$_2$ film 2 on the wafer is removed thereby exposing the principal surface of substrate 1.

Then, as a preliminary process to an epitaxial growth preferably the silicon substrate is preferably etched by the extent of about 0.5 μm depth in order to remove surface of the crystal structure damaged by the ion implantation. This preliminary process is useful in improving the quality of the crystal structure of the epitaxial layer.

Then, an n-type epitaxial layer 7 having specific resistance of 10 Ωcm and 30 μm thick is formed by means of known vapor phase epitaxial growth method by utilizing SiCl$_4$ gas. Subsequently, on the n-type epitaxial layer 7, an SiO$_2$ film 8 is formed, and window 9 is formed on the SiO$_2$ film 8.

During the epitaxial growth of the n-type epitaxial layer 7, the low impurity concentration part 1' on the p$^+$-type buried region 6' serves to effectively hinder auto-doping of p$^+$-impurity into the n-type epitaxial layer 7. Therefore the specific resistance of the epitaxial layer 7 can be accurately controlled.

Figure 7:
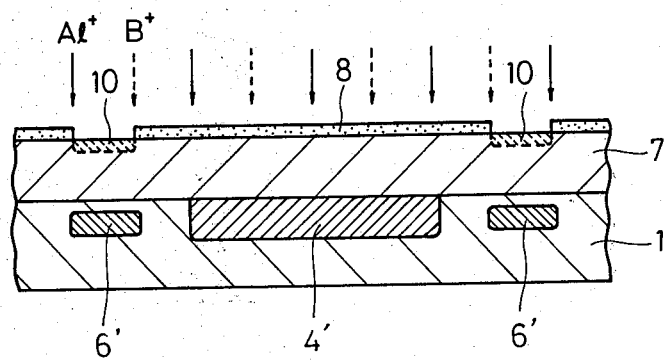

Then, through the window 9 on the SiO$_2$ film 8, Al$^+$-ions and subsequently B$^+$-ions are ion-implanted under the following condition:
for Al$^+$-ions
implanted energy—80 KeV
implanted dose—5×10$^{15}$ atoms/cm$^2$,
for B$^+$-ions
implanted energy—50 KeV
implanted dose—2×10$^{15}$ atoms/cm$^2$,
thus forming the ion implanted region 10 as shown by FIG. 7.

Figure 8:
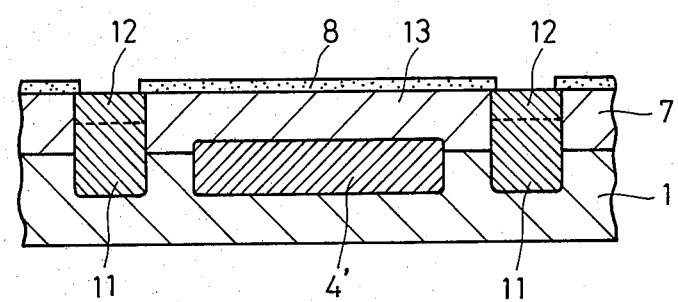

After the abovementioned ion implantation, in order to activate the Al$^+$ and B$^+$ ions, an anealing is carried out and subsequently a drive-in is made at 1200° C. for 3 hours, thereby obtaining the construction as shown by FIG. 8.

Figure 9:
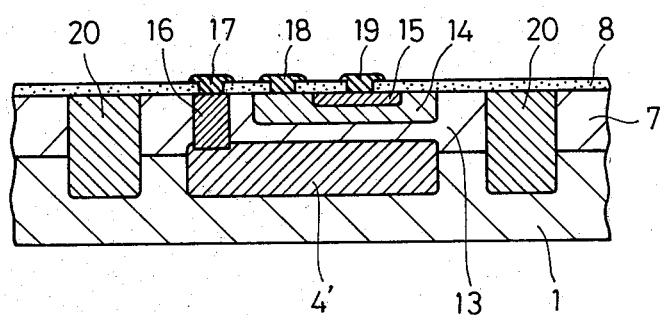

As a result of the abovementioned drive-in, the Al$^+$-ions in the p$^+$-type buried region 6' and the ion-implanted region 10 quickly diffuse in the n-type epitaxial layer 7 from both directions, and the diffused regions 11 and 12 formed by Al impurities from both directions from continuous graft p$^+$-type isolation region 20 as shown by FIG. 9, and the graft isolation region 20 defines by encircling therein an island region 13.

In the abovementioned drive-in process, Al$^+$-ions evaporate from the surface of the n-type epitaxial layer 7, thereby lowering Al-ion concentration at the surface part of the epitaxial layer 7. However, the B$^+$-ions do not evaporate but remain at the surface part, and therefore, the total concentration of p$^+$-type ions at the surface part of the n-type epitaxial layer 7 remain sufficiently high.

In a modified example, the ion implantation of B$^+$-ions can be dispensed with, by a thermal diffusion of B$^+$-ions from the surface of the epitaxial layer after completion of the drive-in.

After the abovementioned process, a bipolar device, for example a bipolar transistor is formed by known method in the island region 13, as shown in FIG. 9, wherein the region 13 is an n-type collector region, 14 is a p-type base region, 15 is an n-type emitter region, 16 is a collector wall region and 20 is the p$^+$-type graft isolation region to isolate the island region 13 from the remaining part of the n-type epitaxial layer 7. Finally, collector electrode 17, base electrode 18 and emitter electrode 19 are formed by known method.

In accordance with the method of making semiconductor IC of the present invention, due to very quick diffusion of Al$^+$-ions into the n-type epitaxial layer 7, manufacturing productivity is drastically improved in comparison with the conventional method. Furthermore by means of smallness of auto-doping of p$^+$-ions into the n-type epitaxial layer, which later becomes the collector layer, intended increase of working voltage of the bipolar device is certainly obtainable as designed, and also scattering of the characteristic of the IC is minimized.

What is claimed is:
1. Method of making semiconductor device comprising the steps of
ion-implanting Al-ions in a predetermined part of the surface of a p-type silicon substrate,
heat treating said substrate to diffuse said Al-ions thereby forming p$^+$-type buried region in said substrate,
epitaxially growing an n-type epitaxial layer having a predetermined thickness on said p-type silicon substrate,
ion-implanting Al-ions on the part of the surface of said n-type epitaxial layer over said p$^+$-type buried region thereby to form p$^+$-type surface ion-implanted region,
heat treating said substrate and the n-type epitaxial layer thereby to make diffusions of Al-ions from said buried region and said surface ion-implanted region into said n-type epitaxial layer, thereby forming a p$^+$-type isolation region continuously across said n-type epitaxial layer.

2. Method of making semiconductor device in accordance with claim 1, wherein B$^+$-ions are ion-implanted when ion-implanting Al$^+$-ions on the surface of said n-type epitaxial layer.

3. Method of making semiconductor device in accordance with claim 1, wherein prior to said epitaxial growing, principal surface of said silicon substrate is etched by HCl gas.

* * * * *